United States Patent [19]
Cochran et al.

[11] Patent Number: 6,005,404
[45] Date of Patent: Dec. 21, 1999

[54] ENVIRONMENTAL TEST APPARATUS WITH PARTITION-ISOLATED THERMAL CHAMBER

[75] Inventors: John Cochran, Fort Wayne, Ind.; Roger L. Perry, Franksville, Wis.

[73] Assignee: RPI, Inc., Racine, Wis.

[21] Appl. No.: 08/841,216

[22] Filed: Apr. 30, 1997

[51] Int. Cl.⁶ .................................................. G01R 31/02
[52] U.S. Cl. ........................................ 324/760; 324/158.1
[58] Field of Search .................................... 324/760, 754, 324/158.1; 312/1; 74/17, 8, 18; 454/184

[56] References Cited

U.S. PATENT DOCUMENTS

| | | | |
|---|---|---|---|
| 3,656,058 | 4/1972 | Leathers | 324/158 F |
| 3,710,251 | 1/1973 | Hagge et al. | 324/760 |
| 4,115,736 | 9/1978 | Tracy | 324/760 |
| 4,172,993 | 10/1979 | Leach | 324/760 |
| 4,572,283 | 2/1986 | Vanderschaaf | 165/61 |
| 4,683,424 | 7/1987 | Cutright et al. | 324/158 F |
| 4,926,118 | 5/1990 | O'Connor et al. | 324/760 |
| 4,949,031 | 8/1990 | Szasz et al. | 324/158 F |
| 5,003,156 | 3/1991 | Kilpatrick et al. | 219/209 |
| 5,093,982 | 3/1992 | Gussman | 29/705 |
| 5,226,326 | 7/1993 | Polen et al. | 73/571 |
| 5,397,998 | 3/1995 | Soeno et al. | 324/760 |
| 5,457,398 | 10/1995 | Schwindt et al. | 324/158.1 |

*Primary Examiner*—Ernest Karlsen
*Attorney, Agent, or Firm*—Jansson, Shupe, Bridge & Munger, Ltd.

[57] ABSTRACT

Disclosed is an environmental test apparatus having a thermal chamber for stress testing electronic products. The apparatus has a carrier for supporting the products in the chamber and equipment for monitoring product characteristics during stress testing. The improved apparatus has an auxiliary chamber in which ambient temperature and humidity conditions prevail. A flexible partition is interposed between the thermal and auxiliary chambers, the monitoring equipment is in the auxiliary chamber and the carrier having products under test mounted thereon is in the thermal chamber. A conveying mechanism is in the auxiliary chamber and the support platform is in driven engagement with such mechanism, thereby causing movement of the platform along the auxiliary chamber.

20 Claims, 8 Drawing Sheets

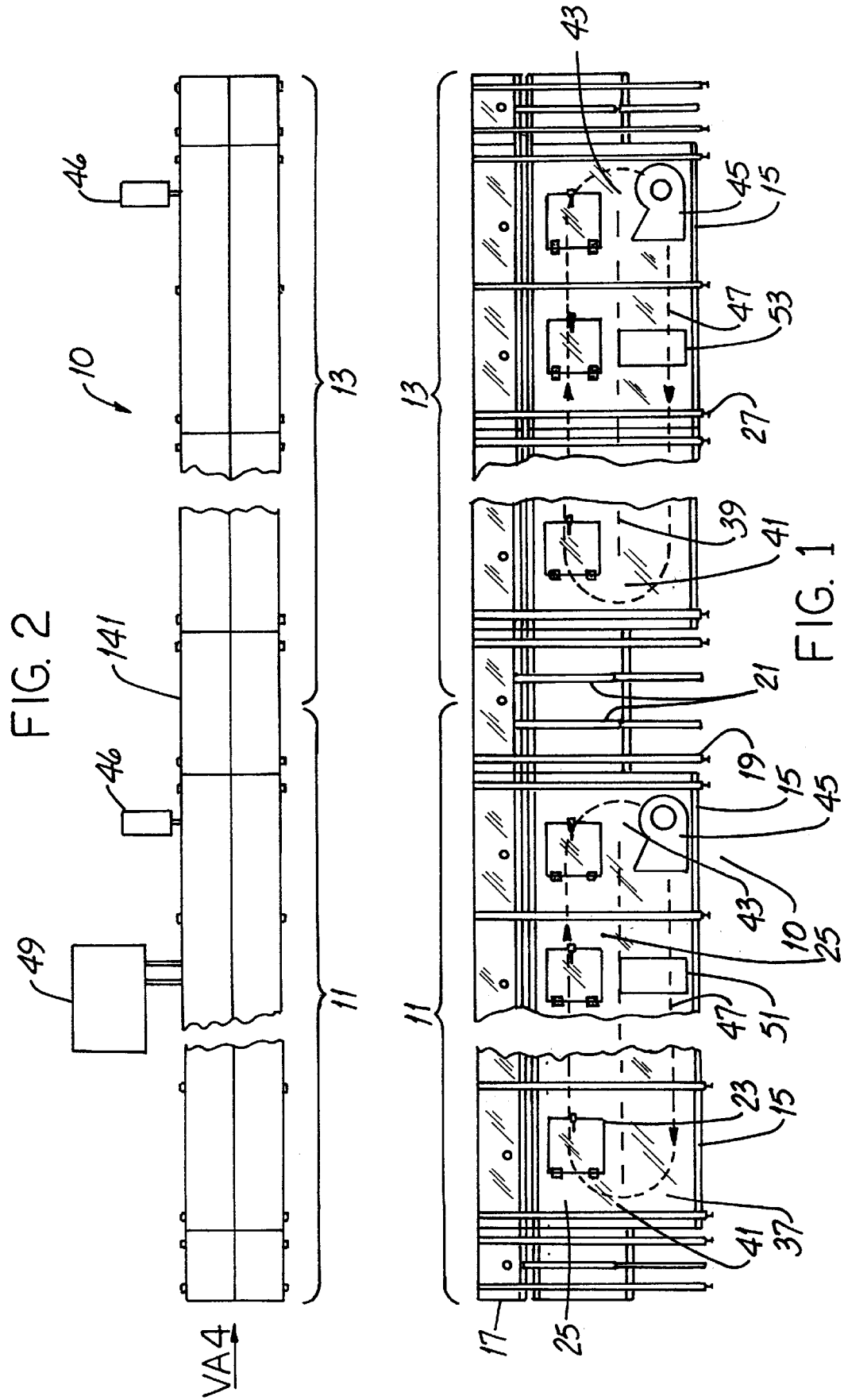

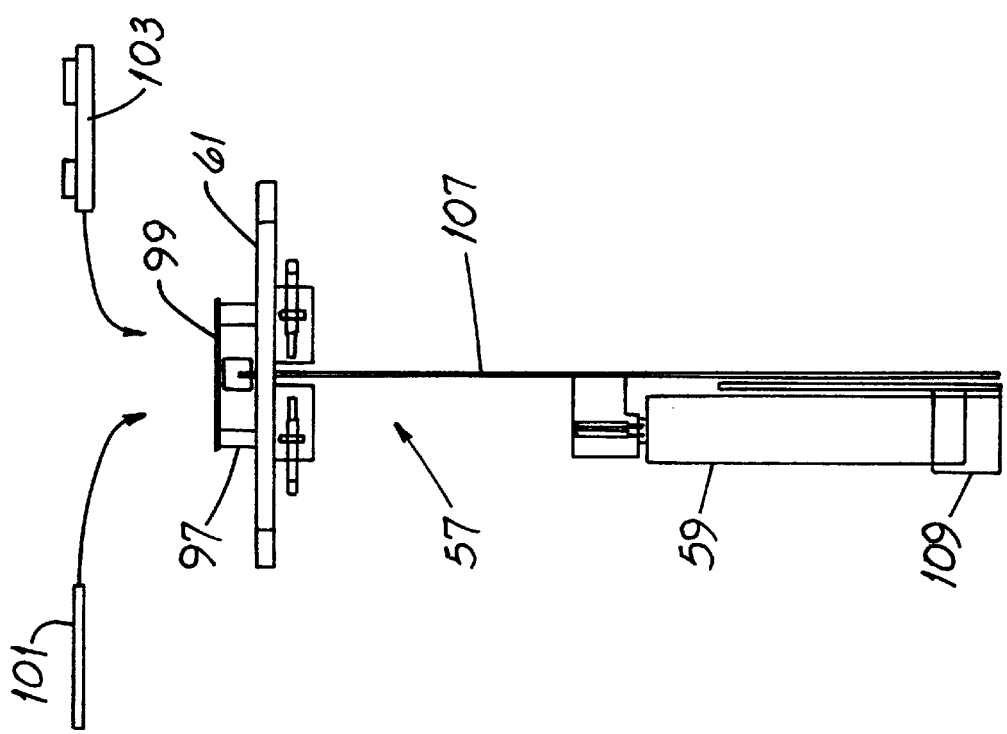
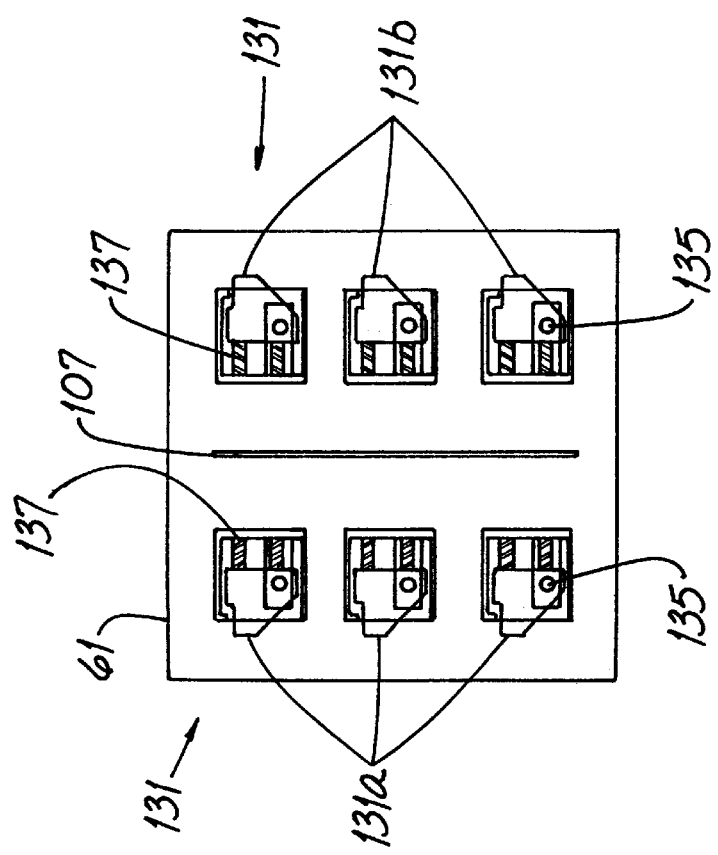

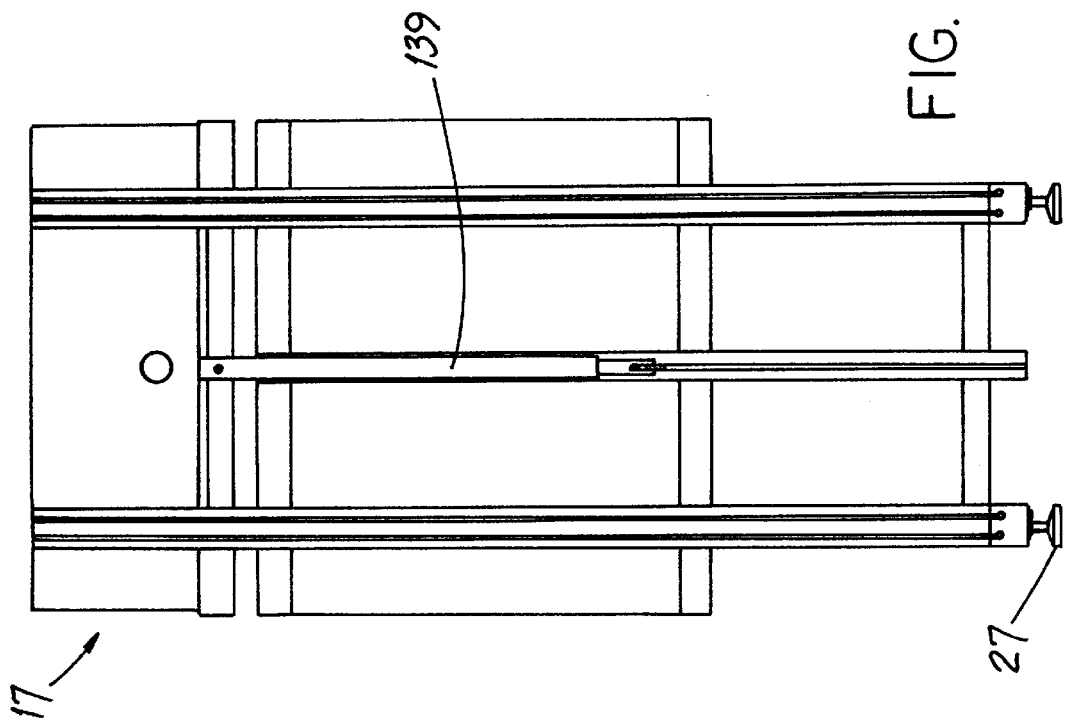
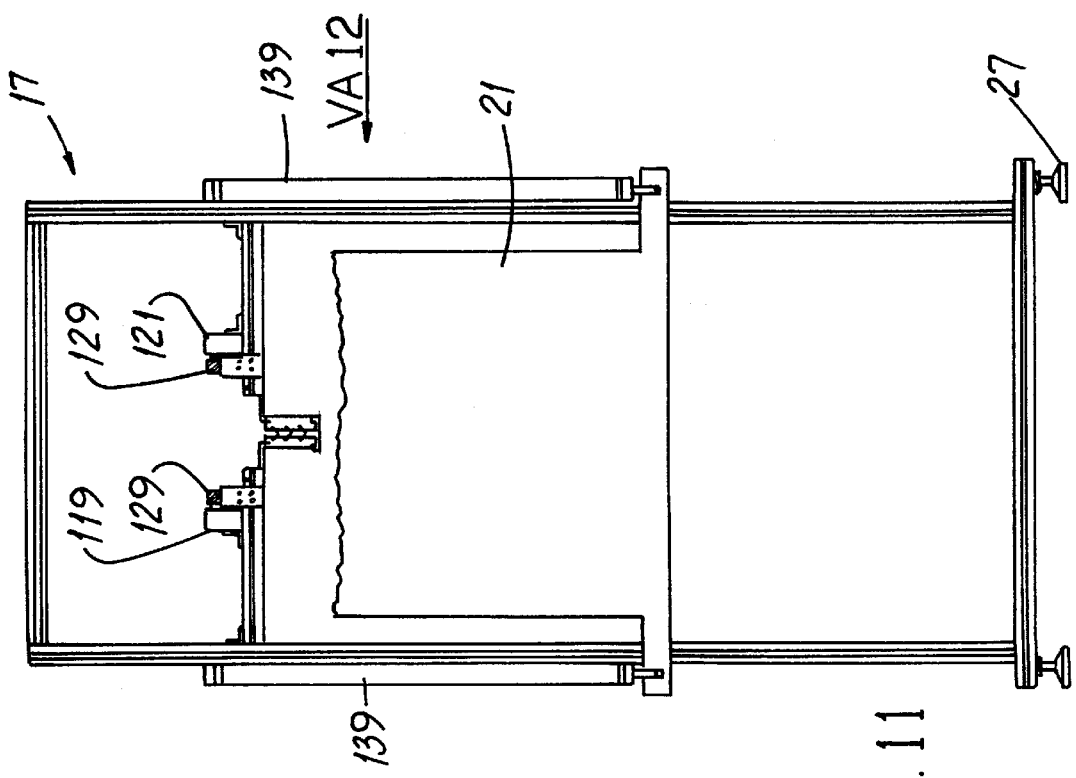

ENVIRONMENTAL TEST APPARATUS WITH PARTITION-ISOLATED THERMAL CHAMBER

FIELD OF THE INVENTION

This invention relates generally to electrical measuring and testing and, more particularly, to product measuring and testing involving temperature cycling.

BACKGROUND OF THE INVENTION

Environmental test chambers are widely used to test electrical products such as printed circuit boards and other electrical/electronic products which include a printed circuit board as a component part. Such testing involves monitoring certain electrical operating characteristics of the product while it is undergoing extreme changes in temperature. Temperature cycling over a range of +125° C. to −65° C. (about +255° F. to −85° F.) is not uncommon and is often accompanied by extreme changes in humidity and/or by vibrating the product under test. In the industry, testing of this type is often referred to as "stress testing."

A primary reason that product stress testing is undertaken is to identify particular products (within a larger group of products) which exhibit characteristics evidencing probable premature failure. And such testing is intended to cull out those products which actually fail during test. In the vernacular of the industry, such products are said to exhibit "infant mortality." Those products which do not exhibit infant mortality are much more reliable in the automotive, aircraft, military or other application in which they are used. U.S. Pat. Nos. 3,656,058 (Leathers); 4,683,424 (Cutright et al.); 4,949,031 (Szasz et al.) and 5,021,732 (Fuoco et al.) all disclose apparatus used for environmental stress testing.

Designers of environmental test chambers must deal with a number of engineering considerations. One is the rapidity with which the temperature in the product-containing chamber can be changed. In a test chamber having refrigeration and heating systems of a particular size, the rate at which the temperature can be changed is, in significant part, a function of the mass (e.g., the mass of the products and product carriers) in the chamber. This is so because the heat absorbed by the chamber contents and the heat which must be removed therefrom is a function of such mass.

A household refrigerator is a good analogy of the foregoing. For a particular refrigerator, two pounds of foodstuffs in the refrigerator are more quickly cooled to a particular temperature than twenty pounds of foodstuffs. And as a corollary, cooling twenty pounds of foodstuffs to a particular temperature within a stated time requires a larger refrigeration unit than is required to cool two pounds of foodstuffs to the same temperature within the same time.

Another engineering consideration involves the equipment used to monitor the electrical operating characteristics of the products under test. Such equipment is temperature sensitive and must be maintained nominally at room ambient conditions. In other words, such equipment should not be in the chamber with the products undergoing test.

Still another engineering consideration is whether to configure the test chamber for batch-process or continuous-process testing. The apparatus of above-noted Szasz et al. patent is for batch testing in that a number of products are placed on a pallet which is inserted into the chamber. All the products on the pallet undergo test simultaneously and after such test is completed, the pallet and its "batch" of products is removed and another pallet loaded with products to be tested is inserted.

On the other hand, the vibration chamber disclosed in U.S. Pat. No. 5,226,326 (Polen et al.) may be referred to as a type of continuous testing arrangement. Such chamber uses a conveyor having spaced pairs of rollers to grasp respective edges of flatwise-oriented printed circuit boards to be tested. Similarly, U.S. Pat. No. 5,397,998 (Soeno et al.) discloses several different arrangements of a conveyor and products to be tested carried atop such conveyor. In one arrangement, feeder apparatus along the conveyor supply electric power to the products during burn-in and the "burned-in" products are then tested after exiting at the end of the conveyor.

While these earlier arrangements are thought to have been generally satisfactory for their intended uses, they are not without disadvantages for some types of applications. For example, the conveying arrangements shown in the Soeno et al. patent apparently do not permit instrumented product testing while the product is moving through the chamber. In other words, such instrumented testing is carried out after the product leaves the burn-in chamber. The "failure mode" characteristics exhibited by the products while in the burn-in chamber and after they leave such chamber may differ markedly.

Yet another disadvantage of the conveying arrangements of the Soeno et al. patent is that the mass of the conveyor (as well as that of the product to be tested) is in the burn-in chamber. Chamber temperature changes can be accomplished and maintained only by adding heat to or removing heat from the conveyor components.

Still another disadvantage of prior art arrangements is that they seemingly have not appreciated how to configure test chambers so that the size and capacity thereof can be selected or changed to suit a particular application. For example, the arrangement shown in FIG. 5 of the Polen et al. patent apparently has a fixed length which cannot be changed. At least, there is no suggestion to the contrary.

A new environmental test apparatus which addresses certain shortcomings of earlier apparatus would be an important advance in the art.

OBJECTS OF THE INVENTION

It is an object of the invention to provide an environmental test apparatus which overcomes certain problems and shortcomings of the prior art.

Another object of the invention is to provide an environmental test apparatus which is useful for stress testing electrical and electronic products.

Another object of the invention is to provide an environmental test apparatus which permits simultaneous product electrical testing and temperature stress testing.

Still another object of the invention is to provide an environmental test apparatus which minimizes the mass contained in the thermal chamber.

Another object of the invention is to provide an environmental test apparatus which implements continuous process testing.

Another object of the invention is to provide an environmental test apparatus by which continuous process testing may be carried out while maintaining the test instrumentation substantially at room ambient conditions.

Yet another object of the invention is to provide an environmental test apparatus which may be "custom-configured" for any one of a variety of applications. How these and other objects are accomplished will become apparent from the following descriptions and from the drawings.

SUMMARY OF THE INVENTION

The invention involves an environmental test apparatus of the type having a thermal chamber for stress testing electronic products. Such apparatus includes a carrier for supporting the products in the chamber and instrument-type test equipment for monitoring product characteristics during stress testing.

The improved apparatus has an auxiliary chamber and a flexible partition interposed between the thermal and auxiliary chambers. The carrier is in the thermal chamber (where the temperature environment is made intentionally harsh) and the test equipment is in the auxiliary chamber which is nominally at room ambient temperature and humidity. A highly preferred embodiment of the carrier includes a flat, sheet-like product such as a feedthrough card having attached thereto a fixture for releasably mounting an electronic product, e.g., a printed circuit board, on the carrier.

The carrier includes first and second opposed, parallel carrier surfaces and the partition includes first and second partition members bearing against the first and second carrier surfaces, respectively. A preferred partition member is a strip-mounted brush with carbon-bearing bristles for reducing static electricity. Separate partition members are mounted at either side of the carrier and resiliently bear against a respective carrier surface to prevent significant air transfer between the chambers.

It is particularly desirable to prevent warmer, more humid air in the auxiliary chamber from migrating or transferring to the thermal chamber since such transfer speeds the rate at which frost accumulates in the thermal chamber. In a highly preferred apparatus, there are plural partitions, one being a primary partition. One (and preferably two) auxiliary partitions are spaced from one another and from the primary partition and are interposed between the primary partition and the auxiliary chamber.

While the partition members perform acceptably to prevent air transfer between chambers and, particularly, to prevent such transfer from the auxiliary chamber to the thermal chamber, it is preferred to take yet additional measures to inhibit air transfer. The spaced-apart partitions define a flow path between them. Dry air is caused to flow along the flow path, thereby substantially preventing moisture from migrating from the auxiliary chamber to the thermal chamber.

The new apparatus has yet other features which facilitate movement of the carrier along the thermal chamber and which facilitate product monitoring during temperature stress testing. The apparatus includes a support platform in the auxiliary chamber. The carrier is attached to the support platform and extends downwardly through the partition. An exemplary support platform is a square or rectangular slab made of DELRIN™ plastic or the like.

A conveying mechanism is also in the auxiliary chamber and the platform is in driven engagement with the conveying mechanism to cause movement of the platform along the auxiliary chamber. A specific conveying mechanism has two spaced-apart sections, each such section comprising an endless belt supported by rollers and, typically, driven by one roller. The spaced-apart edges of the platform rest on respective conveying sections.

It is also highly desirable to be able to electrically operate the products under stress test as they move along through the apparatus. Thus, the auxiliary chamber contains a power bus embodied as two parallel, spaced-apart rails. The support platform includes collector shoes in electrically-conductive relationship to the power bus, thereby providing power to products mounted on the carrier. In one preferred embodiment, a test board or a board computer is in the auxiliary chamber, is supported by the platform, moves with such platform and is electrically connected to both the power bus and to the product(s) under test.

To better accommodate several product carriers with their associated platforms, the thermal chamber is horizontally elongate and an air plenum is coextensive with the thermal chamber. The air plenum is isolated from the thermal chamber along most of the length of both but there are openings at either extreme end of the plenum and thermal chamber so that the plenum is in air flow communication with such chamber. A motor-driven blower, e.g., a centrifugal blower, urges air along the plenum and the thermal chamber. A refrigeration evaporator is in the air plenum so that the air being circulated along the plenum and the thermal chamber may be cooled for stress test purposes.

The new apparatus is thoughtfully configured so that it can be applied in any one of several application requirements. The apparatus includes a plurality of modules attached to one another. The modules cooperatively function in "building block" fashion in that a portion of the thermal chamber is in each of the modules. Stated in other words, the modules can be attached to one another end to end to form an apparatus of the desired length and product testing capacity. The plurality of modules includes at least one module having a door mounted for movement between an open position for placing products in the thermal chamber and a closed position for stress testing the products. Typically, a door module is placed at either end of the assembly of modules. And, conveniently, each module has levelling feet, thereby permitting the modules to be aligned with one another.

Because the new apparatus has thermal and auxiliary chambers which are isolated from one another and because the auxiliary chamber is essentially always at room ambient temperature, the chambers preferably have differing wall configurations. The auxiliary chamber has a plurality of first walls, the thermal chamber has a plurality of second walls and each of the second walls is substantially thicker than each of the first walls. And each of the second walls includes an insulation layer making up at least one-half of the wall thickness.

Other details of the new apparatus are set forth in the following detailed description and in the drawings.

BRIEF DESCRIPTION OF THE DRAWINGS

FIG. 1 is a representative front elevation view of the new test apparatus using plural modules. Separating panels and air flow paths within the apparatus are shown in dashed line. Parts are broken away.

FIG. 2 is a top plan view of the apparatus of FIG. 1. Parts are broken away.

FIG. 5 is an elevation view of the product carrier and the product mounted thereon as shown in FIG. 4.

FIG. 10 is a top plan view of a portion of the product carrier shown in FIGS. 4, 5 and 6. Such view is along viewing axis VA10 of FIG. 6.

FIG. 11 is a representative elevation view of a door module of the apparatus of FIG. 1. Such elevation view is along viewing axis VA4 of FIGS. 2 or 3.

FIG. 12 is an elevation view of the door module of FIG. 11 taken along the viewing axis VA12 thereof.

DETAILED DESCRIPTIONS OF PREFERRED EMBODIMENTS

Figure 3:
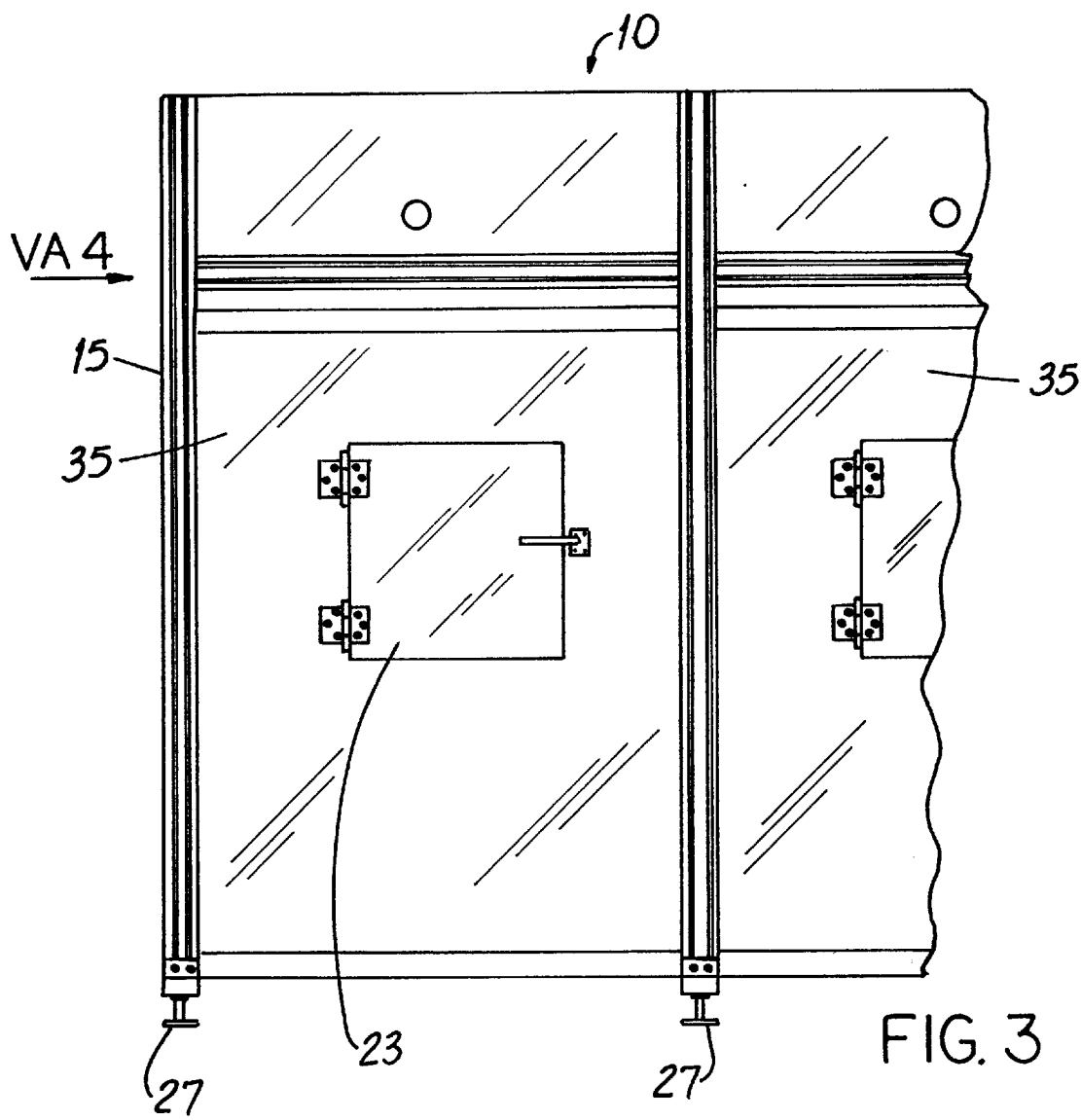
FIG. 3 is an elevation view of plural modules used in the apparatus of FIGS. 1 and 2. One module is broken away.

Before describing details of the new test apparatus 10, it will be helpful to have an overview description of its general arrangement and operation. Referring first to FIGS. 1, 2 and 3, an exemplary embodiment of the new environmental test apparatus 10 has first and second sections 11 and 13, respectively. The first section 11 has several modules 15 coupled to one another and the section 11 is terminated by an entry door module 17 at one end and by an exit door module 19 at the other end.

It is to be appreciated that either section 11, 13 may be used alone to conduct only cold stress testing or only hot stress testing, respectively. When a section 11 is used as an apparatus 10 for cold stress testing only, it is highly preferred to configure the exit door module 19 to have two spaced-apart doors 21. In that way, the doors 21 can be operated sequentially to provide what might be described as an air lock. (It will be apparent from the specification that the doors 21 may be used to remove products from the section 11 and that the right-hand door 21 may be used to place products into section 13.)

Figure 4:
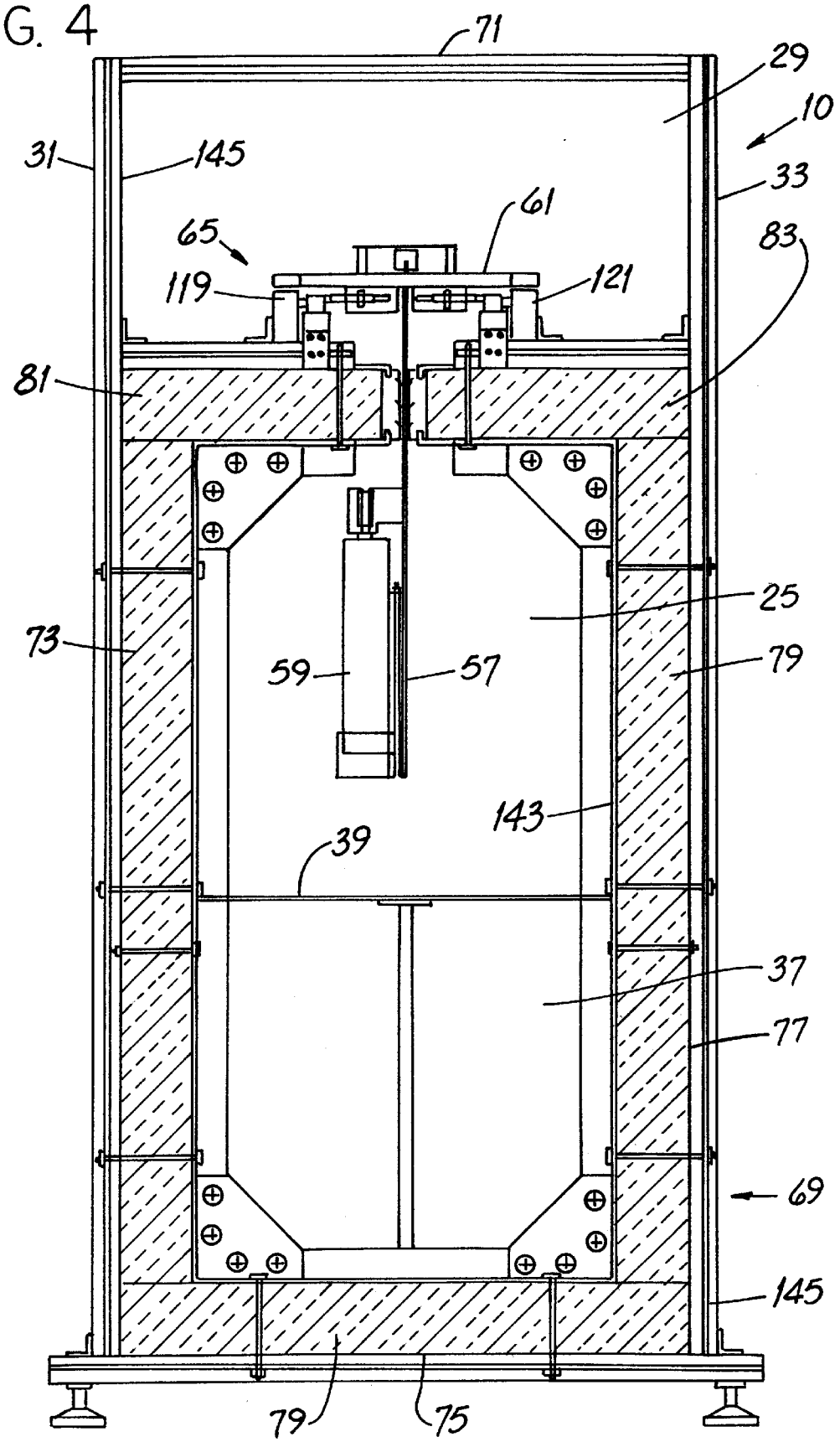
FIG. 4 is a sectional elevation view of a module taken along the viewing axis VA4 of FIG. 2 or FIG. 3.

Each of the modules 15 has an access door 23 for convenient entry into the thermal chamber 25. And, conveniently, each module 15, 17, 19 has levelling feet 27, thereby permitting the modules 15, 17, 19 to be aligned with one another. Referring also to FIG. 4, an auxiliary chamber 29, described in more detail below, is between the walls 31, 33.

The thermal chamber 25 is horizontally elongate (at least by virtue of two or more modules 15 being attached to one another) and a part of such chamber 25 is within each module 15 behind (to a viewer of FIG. 3) a panel 35. An air plenum 37 is below the thermal chamber 25 and along most of the length of both, the chamber 25 and the plenum 37 are isolated from one another by an imperforate panel 39. But the panel length (measured left-right in FIG. 1) is less than the length of the plenum 37 and chamber 25, thereby providing openings 41, 43 at respective extreme ends of the plenum 37 and chamber 25. A blower 45, e.g., a centrifugal blower, driven by a motor 46 urges air along an elongate, "race track shaped" path 47 through the plenum 37 and the thermal chamber 25. A heat exchange device is embodied as a refrigeration system 49, the evaporator 51 of which is in the air plenum 37. The air being circulated along the plenum 37 and the thermal chamber 25 may thereby be cooled for stress test purposes.

From the foregoing, it is apparent that the first section 11 is configured for use only in depressed-temperature (i.e., depressed from ambient temperature) stress testing. The second section 13 is configured for use only in elevated-temperature stress testing.

The second section 13 differs from the first in that a heating system 53 rather than a refrigeration evaporator 51 is in the air plenum 37. In a specific embodiment, the system 53 includes electrical resistance heaters.

Figure 6:
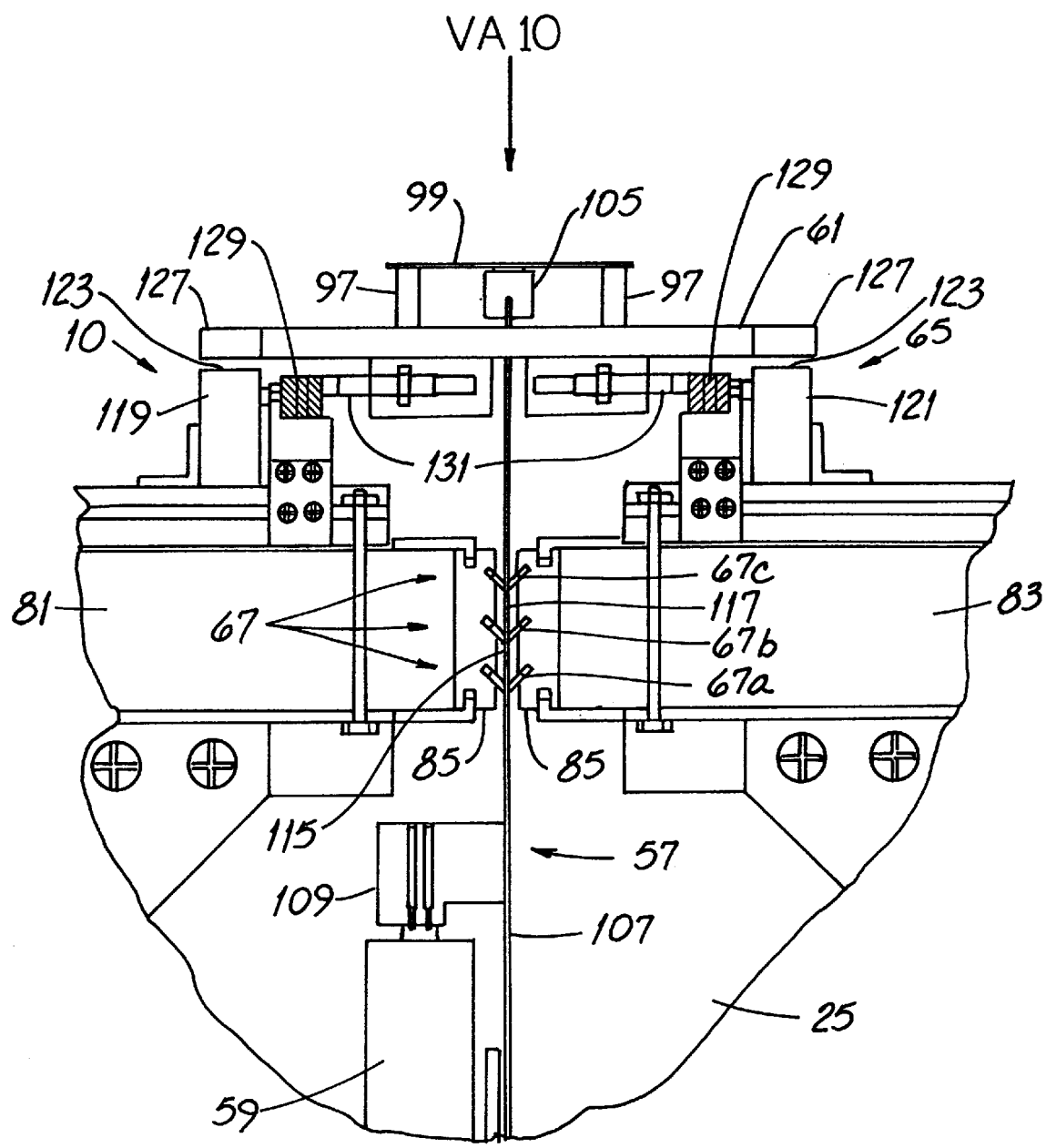
FIG. 6 is an elevation view of a portion of FIG. 4 enlarged to show additional detail. Parts are broken away.
Figure 7:
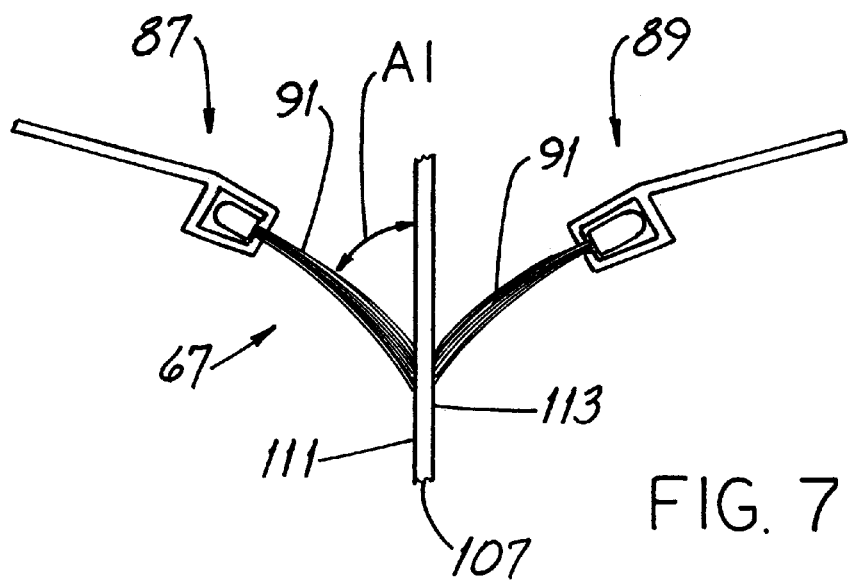
FIG. 7 is an elevation view of a flexible partition shown in conjunction with a feedthrough card of the product carrier.

Referring also to FIGS. 5, 6 and 7, the general interior arrangement of the apparatus 10 includes a flat, vertically-oriented carrier 57 on which a product 59 to be tested is mounted. The carrier 57 is suspended from a platform 61 which is urged along the auxiliary chamber 29 by a conveyor 65 and flexible partitions 67 isolate the auxiliary chamber 29 and the thermal chamber 25 from one another. These features will now be described in more detail.

The new test apparatus 10 has an enclosure 69, within which is the auxiliary chamber 29, the thermal chamber 25 and the air plenum 37. The auxiliary chamber 29 is bounded in part by first walls 31, 33, 71 which are substantially free of insulation and the thermal chamber 25 is bounded in part by second walls 73, 75, 77, each comprised in significant part of an insulation layer 79. In a specific embodiment, the thickness of each layer 79 is over one-half of the total thickness of a wall 73, 75, 77.

Figure 8:
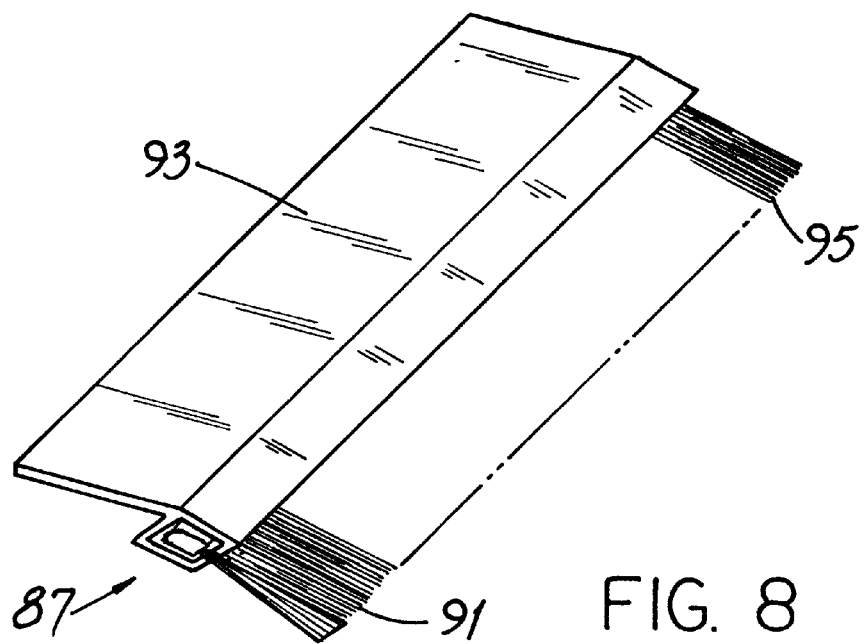
FIG. 8 is a perspective view of a typical partition member used in the partition of FIG. 7.

Referring also to FIG. 8, opposed barrier walls 81, 83 extend from the rear and front, respectively, of the apparatus 10 and each wall 81, 83 terminates in a mounting piece 85. The pieces 85 are spaced slightly from one another and serve to positionally hold a flexible primary partition 67a, the purpose of which is described below. Such primary partition 67a is comprised of first and second partition members 87, 89, respectively, and a preferred partition member 87, 89 includes a brush 91 affixed to an extruded aluminum strip 93 and having flexible bristles 95 which are carbon-bearing bristles for reducing static electricity. Appropriate partition members 87, 89 are available from Sealeze Corporation, Richmond, Va.

A highly preferred apparatus 10 has plural partitions 67, the first auxiliary partition 67b also being comprised of a separate set of members 87, 89, and the second auxiliary partition 67c further being comprised of yet another separate set of members 87, 89. The partitions 67b, 67c are spaced from one another and as is apparent from FIGS. 4 and 6, are interposed between the primary partition 67a and the auxiliary chamber 29. As shown in FIGS. 6 and 7, the brushes 91 of the members 87, 89 are angled with respect to one another and to the carrier card 107 and each such brush 91 defines an acute angle A1 with the carrier 57. Such angled orientation is preferred since, when there is no carrier card 107 between the members 87, 89, such members straighten somewhat and enmesh to form a seal through which air does not easily pass.

A support platform 61 has standoffs 97 mounted atop it for securing a test bed 99 having exposed electrical contact points. An exemplary support platform 61 is a square or rectangular slab about one-half inch thick (about 1.27 cm.) and made of DELRIN™ plastic or the like.

Instrument-type test boards such as a load board 101 or a computer board 103 may be mounted on the test bed 99. A load board 101 applies a load to the product 59 under test to simulate the load or aspects of the load the product 59 will experience in actual application. A computer board 103 periodically "interrogates" the product 59 under test and stores the information for later retrieval and analysis. Points on the test bed 99 and points on the carrier 57 are in electrical contact with one another using edge connectors 105 or other known means.

And it may be desirable to "exercise" a product 59 undergoing stress test by carrying out an operating regimen substantially like that the product 59 will experience in an actual application. To that end, an embodiment of the apparatus 10 shown in FIG. 13 includes a probe 106. The probe 106 is configured to be lowered and raised to electrically connect with the load board 101, board computer 103, the test bed 99 or some other "interface" board supported by the platform 61 and connected to the product 59. The probe 106 is further described below.

A preferred carrier 57 includes what is known as a "feedthrough card 107." A typical card 107 is thin, generally flat, rectangular and has a substantial number of electrical conductors laminated between two insulating layers bonded together. Each of the conductors is "brought out," i.e., exposed at opposite card ends, for making electrical connections thereto. Attached to the carrier 57 is a fixture 109 for releasably mounting an electronic product 59, e.g., a printed circuit board, on the carrier 57.

The carrier 57 is coupled to the support platform 61 and extends downwardly through the partitions 67a, 67b, 67c. The partition members 87, 89 of each partition 67a, 67b, 67c bear against respective surfaces 111, 113 of the card 107. As is now apparent, the partitions 67a, 67b, 67c coact to prevent significant air transfer between the chambers 25, 29.

It is particularly desirable to prevent warmer, more humid air in the auxiliary chamber 29 from migrating or transferring to the thermal chamber 25 since such transfer speeds the rate at which frost accumulates in the thermal chamber 25. To the end of further inhibiting transfer of humid air to the thermal chamber 25, the primary and first auxiliary partitions 67a, 67b, respectively, define a flow path 115 between them. Dry air is caused to flow along the flow path 115, thereby substantially preventing moisture from migrating from the auxiliary chamber 29 to the thermal chamber 25. Good results are obtained by flowing dry air along either one of the flow paths 115, 117 or along both.

Figure 9:
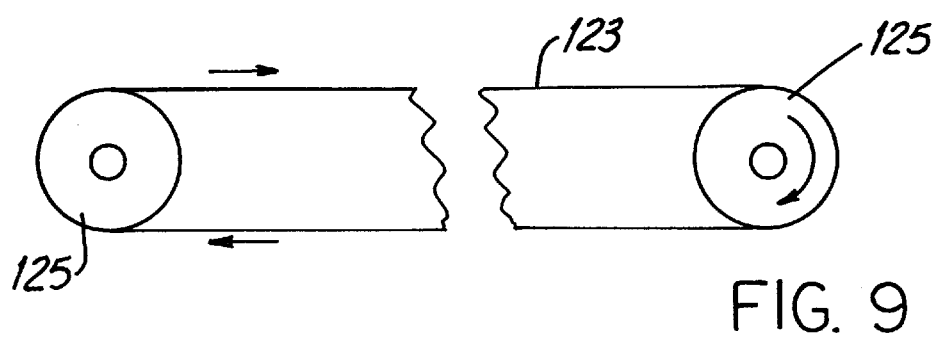
FIG. 9 is a view of a conveyor section used in the apparatus of FIG. 1. Parts are broken away.

Referring next to FIGS. 4, 6 and 9, the conveyor 65 has two spaced-apart sections 119, 121, each such section 119, 121 comprising an endless belt 123 supported by rollers 125 and driven by one roller 125. The spaced-apart edges 127 of the platform 61 rest on respective conveying sections 119, 121. (For clarity, FIG. 6 shows the platform edges 127 spaced slightly above respective conveying sections 119, 121.)

Referring now to FIGS. 4, 5, 6 and 10, it is also highly desirable to be able to electrically operate the products 59 under stress test as they move along through the apparatus 10. Thus, the auxiliary chamber 29 contains a power bus embodied as two parallel, spaced-apart rails 129. The support platform 61 includes collector shoes 131 in electrically-conductive relationship to the power bus rails 129, thereby providing power to products 59 mounted on the carrier 57.

It is highly preferred that electrical continuity between the rails 129, and the support platform 61 and board 101 or 103 mounted thereon be maintained. To that end, the support platform 61 includes a first set of shoes comprising shoes 131a, which are electrically connected in parallel. Similarly, there is a second set of shoes comprising shoes 131b, which are electrically connected in parallel.

In a specific embodiment, each shoe 131 pivots about an axis 135 and is urged toward its respective rail 129 by springs 137. When the platform 61 is so configured, a temporary "bounce" of less than all of the shoes 131a or 131b away from the respective rail 129 will not interrupt the continuity of power to the platform 61.

Referring to FIGS. 1, 2, 4, 11 and 12, the apparatus 10 has at least one module 17 with a door 21 mounted for movement between an open position for placing products 59 in the thermal chamber 25 and a closed position for stress testing the products 59. Door movement is by pneumatic cylinders 139. When the door 21 is closed, it is sealed by an air-inflated seal of a known type. And frost formation on the doors 21 is inhibited by a door heater.

FIGS. 11 and 12 show a single door entry module 17 for purposes of explanation. And the door 21 is broken away to show the interior of the module 17 which is also equipped with conveyor sections 119, 121, bus bars 129 and the like. After appreciating the specification, an exit module 19 and a double door module as shown in FIG. 1 may readily be constructed.

In a highly preferred embodiment, the modules 15, 17, 19 are made using fiberglass sheets 141 for the outer surfaces and aluminum sheets for the inner surfaces 143. Aluminum structural extrusions 145 available from 80/20, Inc. of Columbia City, Ind. are very useful for joining sheets 141, 143 at corners and at sheet edges.

Figure 13:
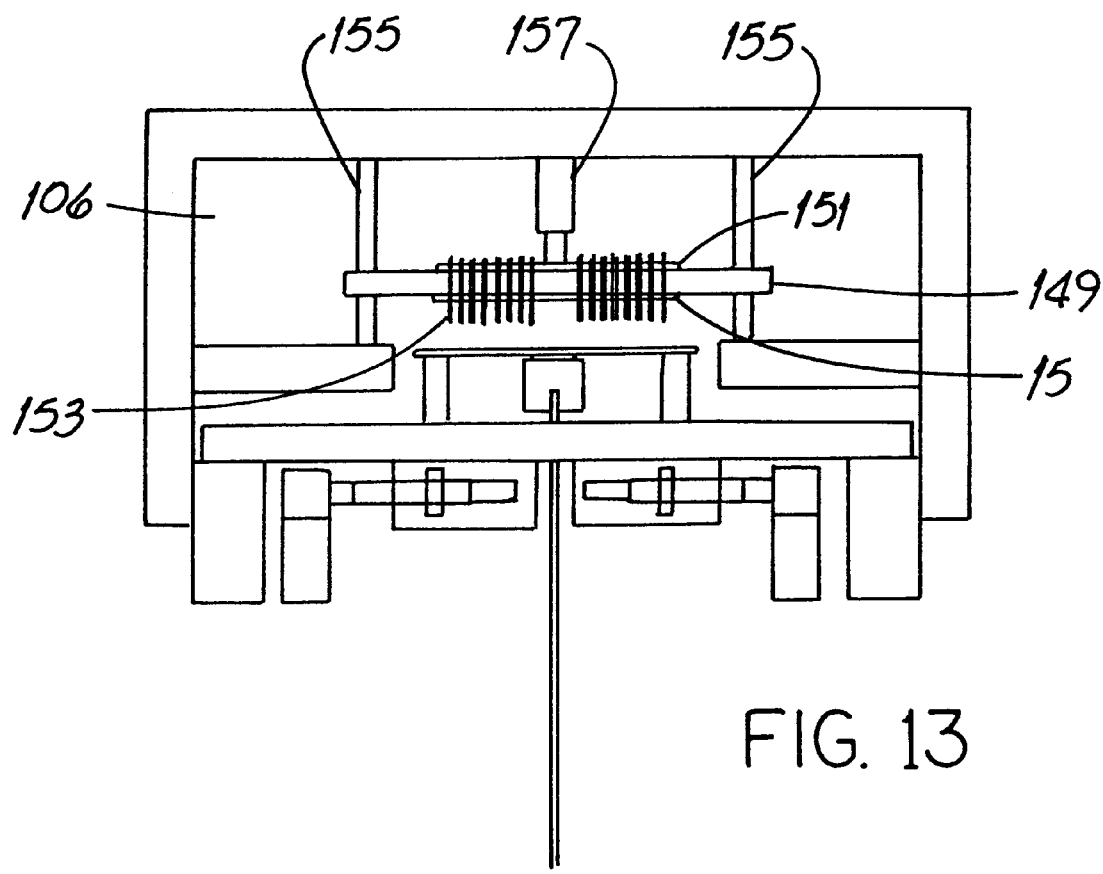
FIG. 13 is a representative elevation view of a portion of another embodiment of the new test apparatus which incorporates a movable test probe. Parts are broken away.

Referring to FIG. 13, the probe 106 includes a stiffening plate 149 having electrical boards 151 mounted thereon. Spring-loaded pins 153 (sometimes referred to "pogo pins") extend through the plate 149 and the boards 151. (The boards 151 and pins 153 are sometimes referred to in the industry as a "bed of nails.")

When the probe 106 is lowered, the pins 153 contact respective points on the bed 99. Guide rods 155 extend through the plate 149 and the plate 149 and the boards 151 move upwardly and downwardly under the control of a pneumatic cylinder 157. It is to be appreciated that the probe 106 may be mounted for vertical movement only rather than for both vertical movement (i.e., up/down in FIG. 13) and horizontal movement (i.e., left/right in FIGS. 1, 2 and 3). But given the specification, persons of ordinary skill will readily appreciate how to configure the probe 106 to move horizontally along the auxiliary chamber 29.

As used herein, the phrase "dry air" means air, the relative humidity of which is in the range of 5–10% or less. As used herein, the term "thermal chamber" means a chamber, the interior of which exhibits wide excursions of temperature, e.g., temperature "swings" of +125° C. to +23° C. (about +255° F. to +73° F.), +23° C. to −65° C. (about +73° F. to −85° F.), or even +125° C. to −65° C. (about +255° F. to −85° F.) during stress testing. The term "stress testing" means testing electrical products using one or more wide temperature excursions.

While the principles of the invention have been shown and described in connection with a few preferred embodiments, it is to be understood clearly that such embodiments are by way of example and are not limiting. As other examples, the new apparatus 10 may be configured to provide "hot only" stress testing, i.e., stressing testing involving temperatures above room ambient. In that instance, the module 15 terminating the section 13 may not require a door 21. A hot air "curtain," or "knife" as it is sometimes called, is adequate.

And cold stress testing may be carried out using a refrigeration unit separate from and ducted to the apparatus 10. Such unit preferably has two redundant evaporator 51 so that one evaporator 51 may be disabled and defrosted while the other evaporator 51 is cooling air flowing through the thermal chamber 25.

What is claimed is:

1. An environmental test apparatus comprising:
   a plurality of walls forming an enclosure, wherein said enclosure has at least a first compartment and a second compartment therewithin and said first compartment has insulating material at least partially therearound for maintaining extreme temperatures therewithin for stress testing electronic products, as the electronic products are conveyed through said first compartment;

a pair of barrier walls which are situated within said enclosure so as to be opposed to each other, wherein said pair of barrier walls divide said first compartment from said second compartment and each barrier wall of said pair of barrier walls have facing end surfaces forming a space therebetween;

first and second partition members which are attached via mounting pieces to said facing end surfaces of said pair of barrier walls to span said space, wherein said first and second partion members are flexible;

a carrier member having a supported end within said second compartment and a main body portion mostly within said first compartment, said carrier member for releasably mounting the electronic products in said first compartment; and equipment for monitoring product characteristics during stress testing, wherein;

said equipment is located within said second compartment to be maintained at ambient air conditions.

2. The environmental test apparatus of claim 1, wherein said carrier member includes first and second carrier surfaces and said first and second partition members end in brushes bearing against said first and second carrier surfaces, respectively.

3. The environmental test apparatus of claim 2, wherein said first and second partition members form a primary partition and said environmental test apparatus includes a first auxiliary partition interposed between said primary partition and said second compartment.

4. The environmental test apparatus of claim 3, wherein said primary and auxiliary partitions define a flow path therebetween such that dry air flows along said flow path, thereby substantially preventing moisture from migrating from said second compartnent to said first compartment.

5. The environmental test apparatus of claim 1, wherein said carrier member includes a fixture for releasably mounting one of the electronic products on said carrier member.

6. The environmental test apparatus of claim 1, further comprising a support platform in said second compartment, wherein said carrier member is attached to a support platform within said second compartment and said carrier member extends through a space between said first and second partition members.

7. The environmental test apparatus of claim 6, further comprising a conveying mechanism in said second compartment such that said support platform is in driven engagement with said conveying mechanism, thereby causing movement of said support platform along compartment.

8. The environmental test apparatus of claim 7, wherein said second compartment contains a power bus therein, and said support platform has collector shoes mounted thereon, said collector shoes being in electrically-conductive relationship to said power bus, thereby providing power to the electronic products releasably mounted on said carrier.

9. The environmental test apparatus of claim 7, further comprising a test board supported on said support platform so as to move with said support platform, wherein said test board is in said second compartment and said test board is in electrically-conductive relationship with at least one of the electronic products.

10. The environmental test apparatus of claim 1, further comprising an air plenum and a blower, wherein said air plenum is coextensive with said first compartment and said air plenum is in air flow communication with said first compartnent, and wherein said blower urges air along both said air plenum and said first compartment.

11. The environmental test apparatus of claim 10, further comprising a refrigeration evaporator in said air plenum.

12. The environmental test apparatus of claim 1, further comprising a plurality of modules attached to one another, wherein a portion of said first compartment is in each of said plurality of modules.

13. The environmental test apparatus of claim 12, wherein said plurality of modules includes at least one module having a door mounted for movement between an open position for placing the electronic products in said first compartment and a closed position for stress testing the electronic products.

14. The environmental test apparatus of claim 13, wherein each module of said pluralitv of modules has leveling feet, thereby permitting each module of said plurality of modules to be aligned with one another.

15. The environmental test apparatus of claim 1, wherein said insulating material, which is at least partially around said first compartment, has a thickness at least twice a thickness a wall of said plurality of walls forming said enclosure.

16. An environmental test apparatus comprising:

a plurality of walls forming an enclosure, wherein said enclosure has at least a first compartment and a second compartment therewithin and said first compartment has insulating material at least partially therearound for maintaining extreme temperatures therewithin for stress test electronic products, as the electronic products are conveyed through said first compartment;

a pair of barrier walls which are situated within said enclosure so as to be opposed to each other, wherein said pair of barrier walls divide said first compartment from said second compartment and each barrier wall of said pair of barrier walls have facing end surfaces forming a space therebetween;

first and second partition members which are attached via mounting pieces to said facing end surfaces of said pair of barrier walls to span said space, wherein said first and second partition members are flexible;

a carrier member having a supported end within said second compartment and a main body portion mostly within said first compartment, said carier member for supporting the electronic products in said first compartment;

equipment for monitoring product characteristics during stress testing, wherein said equipment is located within said second compartment; and a conveyor supports said supported end of said carrier member within said second compartment so that said equipment and said carrier member move in unison.

17. The environmental test apparatus of claim 3, further comprising a second auxiliary partition interposed between said first auxiliary partition and said second compartment.

18. The environmental test apparatus of claim 1, wherein said carrier member includes a feedthrough card which is a thin, generally flat, rectangular structural member formed from a substantial number of electrical conductors laminated between two insulating layers which are bonded together.

19. The environmental test apparatus of claim 10, further comprising an imperforate panel dividing said first chamber from said air plenum.

20. The environmental test apparatus of claim 1, wherein said plurality of walls are formed from fiberglass sheets for outer surfaces, aluminum sheets for inner surfaces, and aluminum structural extrusions for joining edges and corners of said fiberglass sheets and said aluminum sheets.

* * * * *

UNITED STATES PATENT AND TRADEMARK OFFICE
CERTIFICATE OF CORRECTION

PATENT NO. : 6,005,404
DATED : December 21, 1999
INVENTOR(S) : John Cochran, Roger L. Perry It is certified that error appears in the above-identified patent and that said Letters Patent is hereby corrected as shown below:

In column 10, line 57, CLAIM 16, delete "carier", and substitute therefor ---carrier---.

Signed and Sealed this

Fifteenth Day of August, 2000

Attest:

Q. TODD DICKINSON

Attesting Officer

Director of Patents and Trademarks